US009117727B2

(12) United States Patent
Song et al.

(10) Patent No.: US 9,117,727 B2
(45) Date of Patent: Aug. 25, 2015

(54) TRANSISTORS, METHODS OF MANUFACTURING THE SAME, AND ELECTRONIC DEVICES INCLUDING TRANSISTORS

(75) Inventors: I-hun Song, Seongnam-si (KR); Yin Huaxiang, Suwon-si (KR); Sang-hun Jeon, Yongin-si (KR); Sung-ho Park, Yongin-si (KR)

(73) Assignee: SAMSUNG ELECTRONICS CO., LTD., Gyeonggi-do (KR)

(*) Notice: Subject to any disclaimer, the term of this patent is extended or adjusted under 35 U.S.C. 154(b) by 337 days.

(21) Appl. No.: 13/099,806

(22) Filed: May 3, 2011

(65) Prior Publication Data

US 2012/0085999 A1     Apr. 12, 2012

(30) Foreign Application Priority Data

Oct. 12, 2010 (KR) .................. 10-2010-0099292

(51) Int. Cl.
*H01L 27/14* (2006.01)
*H01L 27/00* (2006.01)
*H01L 27/146* (2006.01)

(52) U.S. Cl.
CPC .... *H01L 27/14681* (2013.01); *H01L 27/14692* (2013.01)

(58) Field of Classification Search
CPC ............. H01L 27/14681; H01L 27/14692; H01L 27/144; H01L 27/14614; H01L 27/14643; H01L 27/14665; H01L 27/3287; H01L 31/10; H01L 31/102; H01L 31/1105; H01L 31/12; H01L 31/1123; H01L 31/1126; H01L 31/1129
USPC .............. 257/9, 14–17, 20, 22, 24, E31.033, 257/E31.037, E31.053, E31.054, E31.055, 257/E31.057, E29.068, E29.069, E29.248, 257/43, E33, E33.198, 414, 428, 431, 436; 250/208.1, 214.1, 221, 40
See application file for complete search history.

(56) References Cited

U.S. PATENT DOCUMENTS 4,476,477 A * 10/1984 Capasso et al. ............... 257/185
4,862,237 A * 8/1989 Morozumi ....................... 257/72

(Continued)

FOREIGN PATENT DOCUMENTS

JP     2010056546     3/2010
KR     20030005798     1/2003

(Continued)

OTHER PUBLICATIONS

Janotti et al. Fundamentals of zinc oxide as a semiconductor. Reports on Progress in Physics 72 (2009), 126501, pp. 1-29.*

(Continued)

*Primary Examiner* — Galina Yushina
(74) *Attorney, Agent, or Firm* — Harness, Dickey & Pierce, P.L.C.

(57) ABSTRACT

Example embodiments disclose transistors, methods of manufacturing the same, and electronic devices including transistors. An active layer of a transistor may include a plurality of material layers (oxide layers) with different energy band gaps. The active layer may include a channel layer and a photo sensing layer. The photo sensing layer may have a single-layered or multi-layered structure. When the photo sensing layer has a multi-layered structure, the photo sensing layer may include a first material layer and a second material layer that are sequentially stacked on a surface of the channel layer. The first layer and the second layer may be alternately stacked one or more times.

18 Claims, 11 Drawing Sheets

(56) References Cited

U.S. PATENT DOCUMENTS

| | | | |
|---|---|---|---|
| 5,273,919 A * | 12/1993 | Sano et al. | 438/158 |
| 6,465,803 B1 * | 10/2002 | Bowers et al. | 257/21 |
| 7,061,014 B2 * | 6/2006 | Hosono et al. | 257/43 |
| 7,501,293 B2 * | 3/2009 | Ito et al. | 438/22 |
| 2004/0227865 A1 | 11/2004 | Moon | |
| 2005/0037533 A1 | 2/2005 | Peng et al. | |
| 2006/0284171 A1 * | 12/2006 | Levy et al. | 257/43 |
| 2009/0224238 A1 * | 9/2009 | Kim et al. | 257/43 |
| 2010/0270547 A1 * | 10/2010 | Ahn | 257/43 |

FOREIGN PATENT DOCUMENTS

| | | |
|---|---|---|
| KR | 1020080048726 | 6/2008 |
| KR | 20080104860 | 12/2008 |
| KR | 20100007703 | 1/2010 |

OTHER PUBLICATIONS

Kim et al. Investigsion of effects of Mg incorporation into InZnO for high-performance and high-stability solution-processed thin film transistors. Applied Physics Letters 96, 163506, 2010.*

Shan et al. Effect of oxigen on the electronic band structure of ZnOSe alloyes. Applied Physics Letters, vol. 83, # 2, 2003, pp. 299-301.*

Melidis. On Temperature Dependence of the Hall Effect and Electrical Resistivity of Cd, Ze, and Mg Single Crystals. Phys. State. Sol (a) 47, (1978), pp. K27-K30.*

Zhai et al. A comprehensive Review of One-Dimensional Metal-Oxide Nanostructure Photodetectors. Sensors 2009, 9, pp. 6504-6529.*

* cited by examiner

< COMPARATIVE EXAMPLE >

TRANSISTORS, METHODS OF MANUFACTURING THE SAME, AND ELECTRONIC DEVICES INCLUDING TRANSISTORS

CROSS-REFERENCE TO RELATED APPLICATIONS

This application claims priority under 35 U.S.C. §119 to Korean Patent Application No. 10-2010-0099292, filed on Oct. 12, 2010, in the Korean Intellectual Property Office, the entire contents of which are incorporated herein by reference.

BACKGROUND

1. Field

The present disclosure relates to transistors, methods of manufacturing the transistors, and electronic devices including the transistors.

2. Description of the Related Art

Transistors have been widely used for various purposes in various electronic devices. For example, a transistor is used as a switching device, a driving device, a photo sensing device, or the like, and may be used as a component of various electronic circuits.

The characteristics of a transistor may be considerably changed according to a material and structure of a channel layer. That is, the material, the structure, or the like of the channel layer may be important factors for determining the characteristics of the transistor. Recently, in order to improve operating characteristics of the transistor, a method of using an oxide layer with high carrier mobility as a channel layer has been attempted.

However, since a transistor (e.g., an oxide transistor) including an oxide layer as a channel layer has relatively low photosensitivity, it is not easy to use the transistor in an optical device (e.g., a photosensor).

SUMMARY

Provided are active layers including a plurality of material layers with different energy band gaps, and transistors including the active layers.

Provided are active layers including a photo sensing layer, and transistors including the active layers.

Provided are methods of manufacturing the transistors.

Provided are electronic devices including the transistors.

Additional aspects will be set forth in part in the description which follows and, in part, will be apparent from the description, or may be learned by practice of example embodiments.

According to an aspect of example embodiments, a transistor includes an active layer including an oxide semiconductor, a source and a drain that contact two ends of the active layer, respectively, a gate corresponding to the active layer, and a gate insulating layer disposed between the active layer and the gate. The active layer includes a first layer and a second layer that are sequentially stacked from a side of the gate, and the second layer includes a material with a smaller energy band gap than the first layer.

The first layer may include a ZnO-based oxide.

The ZnO-based oxide may include at least one selected from the group consisting of hafnium (Hf), yttrium (Y), tantalum (Ta), zirconium (Zr), titanium (Ti), copper (Cu), nickel (Ni), chromium (Cr), indium (In), gallium (Ga), aluminum (Al), tin (Sn), and magnesium (Mg).

The first layer may include HfInZnO or GaInZnO, for example.

The second layer may have a single-layered structure, or a multi-layered structure.

The second layer may include a first material layer and a second material layer that are sequentially stacked on a surface of the first layer.

An energy band gap of the first material layer may be smaller than an energy band gap of the second material layer.

The first material layer may include InZnO or TiOx, for example.

An energy band gap of the second material layer may be smaller than an energy band gap of the first layer.

An oxygen content of the second material layer may be greater than an oxygen content of the first layer.

Electrical resistance of the second material layer may be greater than electrical resistance of the first layer.

The second material layer may include an oxide of the same group as the first layer.

The first material layer and the second material may be alternately stacked two or more times.

The gate may be disposed below the active layer.

The gate may be disposed above the active layer.

According to another aspect of example embodiments, an electronic device includes the transistor.

According to an aspect of example embodiments, a photo sensing circuit includes the transistor.

The photo sensing circuit may further include a switching device connected to the transistor.

According to another aspect of example embodiments, a transistor includes an active layer including an oxide semiconductor, a source and a drain that contact two ends of the active layer, respectively, a gate corresponding to the active layer, and a gate insulating layer disposed between the active layer and the gate, wherein the active layer includes a channel layer, and a photo sensing layer with higher photosensitivity than the channel layer, and the channel layer is closer to the gate than the photo sensing layer.

The photo sensing layer may include a material with a smaller energy band gap than the channel layer.

The photo sensing layer may include a first material layer and a second material layer that are sequentially stacked on a surface of the channel layer.

An energy band gap of the first material layer may be smaller than energy band gaps of the second material layer and the channel layer.

An energy band gap of the second material layer may be smaller than an energy band gap of the channel layer.

The first material layer and the second material may be alternately stacked two or more times.

According to another aspect of example embodiments, an electronic device includes the transistor.

According to another aspect of example embodiments, a photo sensing circuit includes the transistor. The photo sensing circuit may further include a switching device connected to the transistor.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1:
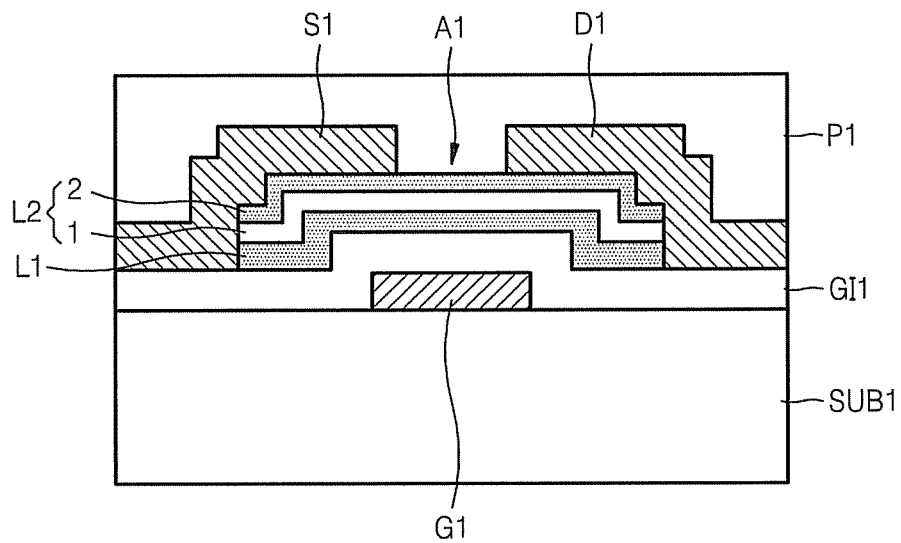
FIG. 1 is a cross-sectional view of a transistor according to an example embodiment.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing example embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes," "including," "has," and/or "having," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, transistors, methods of manufacturing the transistors, and electronic devices including the transistors will be described with regard to example embodiments with reference to the attached drawings. In the drawings, the thicknesses of layers and regions are exaggerated for clarity. Like reference numerals in the drawings denote like elements.

FIG. 1 is a cross-sectional view of a transistor according to an example embodiment. The transistor according to the present example embodiment is a bottom-gate type transistor in which a gate G1 is disposed below an active layer A1.

Referring to FIG. 1, the gate G1 may be disposed on a substrate SUB1. The substrate SUB1 may be a glass substrate, or alternatively, may be any one of various substrates used in a general method of manufacturing a semiconductor device, for example, a plastic substrate, or a silicon substrate. The gate G1 may be formed of a general electrode material (e.g., a metal, a conductive oxide, or the like). For example, the gate G1 may be formed of a metal such as molybdenum (Mo), copper (Cu), titanium (Ti), aluminum (Al), nickel (Ni), tungsten (W), platinum (Pt) and chromium (Cr), a conductive material such as an indium zinc oxide (IZO) and an indium tin oxide (ITO), or an alloy including at least two metals. In addition, the gate G1 may have a single-layer structure, or alternatively, may have a multi-layered structure including a plurality of different material layers. A gate insulating layer GI1 may be formed on the substrate SUB1 so as to cover the gate G1. The gate insulating layer GI1 may be a silicon oxide layer, or a silicon nitride layer, or alternatively, may be another material layer, for example, a high dielectric material layer with a greater dielectric constant than a silicon nitride layer. The gate insulating layer GI1 may have a stack structure including at least two layers from among a silicon oxide layer, a silicon nitride layer, and a high dielectric material layer.

The active layer A1 may be disposed on the gate insulating layer G11. The active layer A1 may be disposed above the gate G1 so as to correspond to the gate G1. A width (which is measured along a horizontal direction in FIG. 1) of the active layer A1 may be relatively greater than a width of the gate G1. The active layer A1 may be formed of an oxide semiconductor, and may have a multi-layered structure including at least two layers. For example, in the present example embodiment, the active layer A1 may include a first layer L1 and a second layer L2 that are sequentially stacked. The second layer L2 may have a single-layered or multi-layered structure. A case where the second layer L2 has a double-layered structure will be described herein. The active layer A1 will be described later in more detail.

A source electrode S1 and a drain electrode D1 may be disposed on the gate insulating layer GI1 so as to contact two ends of the active layer A1, respectively. The source electrode S1 and the drain electrode D1 each may have a single-layered or multi-layered structure. The source electrode S1 and the drain electrode D1 may each be the same material layer as the gate G1, but may each be a different material layer from the gate G1. A passivation layer P1 may be disposed on the gate insulating layer GI1 so as to cover the active layer A1, the source electrode S1, and the drain electrode D1. The passivation layer P1 may be, for example, a silicon oxide layer, a silicon nitride layer, or an organic layer, or alternatively, may have a stack structure including at least two layers thereof.

The active layer A1 will now be described in more detail.

In the active layer A1, the first layer L1 may be disposed closer to the gate G1 than the second layer L2, and may function as a main channel layer. The first layer L1 may be formed of an oxide semiconductor, for example, a ZnO-based oxide semiconductor. In this case, the ZnO-based oxide semiconductor may include at least one selected from a transition metal such as hafnium (Hf), yttrium (Y), tantalum (Ta), zirconium (Zr), titanium (Ti), copper (Cu), nickel (Ni) and chromium (Cr), a group III element such as indium (In), gallium (Ga) and aluminum (Al), a group IV element such as tin (Sn), a group II element such as magnesium (Mg), or other elements. For example, the first layer L1 may include HfInZnO, GaInZnO, or the like. The oxide semiconductor constituting the first layer L1 may be amorphous or crystalline, or the first layer L1 may have a mixture structure of amorphous and crystalline phases. The material of the first layer L1 is not limited to the above-described material, and thus the first layer L1 may be formed various materials. A thickness of the first layer L1 may be equal to or less than about 500 Å, for example. However, according to the material of the first layer L1, the thickness of the first layer L1 may be equal to or more than 500 Å.

The second layer L2 may have higher photosensitivity than the first layer L1. Sensitivity with respect to light, that is, photosensitivity may be related to an energy band gap. As an energy band gap is reduced, photosensitivity may be increased. Thus, the second layer L2 may include a material with a smaller energy band gap than the first layer L1. The second layer L2 may be referred to as a photo sensing layer. The second layer L2 may have a single-layered or multi-layered structure. For example, as illustrated in FIG. 1, the second layer L2 may have a double-layered structure including a first material layer 1 and a second material layer 2. The first material layer 1 and the second material layer 2 may be sequentially stacked on an upper surface of the first layer L1.

An energy band gap of the first material layer 1 may be smaller than that of the second material layer 2. In addition, the energy band gap of the first material layer 1 may be smaller than that of the first layer L1. Thus, the first material layer 1 may be interposed between the first layer L1 and the second material layer 2 which have greater energy band gaps than the first material layer 1. Due to the first material layer 1, photoabsorption efficiency, photoexcitation efficiency, and photocurrent generation efficiency may be increased. For example, the first material layer 1 may include InZnO, TiOx, or the like. However, a material of the first material layer 1 is not limited to the above-described material, and thus the first material layer 1 may be formed of various materials. For example, since as an oxygen content (oxygen amount) of an oxide semiconductor is increased, an energy band gap of the oxide semiconductor may be reduced, an oxide semiconductor having a great oxygen content (oxygen amount) may be used to form the first material layer 1.

The energy band gap of the second material layer 2 may be smaller than that of the first layer L1. As described above, since as an oxygen content of an oxide semiconductor is increased, an energy band gap of the oxide semiconductor may be reduced, an oxygen content of the second material layer 2 may be greater than that of the first layer L1. In addition, since as an oxygen content of an oxide semiconductor is increased, electrical resistance of the oxide semiconductor may be increased, electrical resistance of the second material layer 2 may be greater than that of the first layer L1. The second material layer 2 may facilitate photosensing, and may protect the first material layer 1 and the first layer L1 disposed therebelow. While subsequent processes are performed after the active layer A1 is formed, the characteristics of the active layer A1 may easily change/deteriorate. For example, the electrical conductivity of the active layer A1 may be increased to an undesired level by a plasma process. However, when the second material layer 2 with a high oxygen content and relatively high electrical resistance is disposed uppermost, the second material layer 2 may function as a protective layer so as to prevent the characteristics of the active layer A1 from changing/deteriorating. Also, if the electrical resistance of the second material layer 2 is greater than that of the first layer L1, the second material layer 2 may not function as a back channel. The second material layer 2 may be formed of an oxide semiconductor of the same group as or similar group to the first layer L1. For example, the second material layer 2 may be formed of an oxide semiconductor of the same group as the first layer L1, and an oxygen content of the second material 2 is increased compared to the first layer L1. For example, the second material layer 2 may include HfInZnO or GaInZnO with a higher oxygen content than the first layer L1. That is, the second material layer 2 may be formed of various materials. The second material layer 2 may be formed of an oxide semiconductor of a different group from the first layer L1. In addition, if necessary, the energy band gap of the second material layer 2 may be the same or similar as that of the first layer L1.

A thickness of the second layer L2 may be equal to or less than about 1000 Å, for example, equal to or less than about 750 Å. However, according to a material constituting the second layer L2, the thickness of the second layer L2 may be more than 1000 Å.

As described above, according to the present example embodiment, the photosensitivity of a transistor may be increased by using a photo sensing layer (i.e., the second layer L2) including a material with a smaller energy band gap than that of a main channel layer (i.e., the first layer L1). In addition, the photo sensing layer (i.e., the second layer L2) is formed of a plurality of material layers with different energy band gaps, and thus the characteristics of the active layer A1 may be prevented from changing/deteriorating, thereby improving the reliability and uniformity of the transistor. If the transistor is applied to an electronic device (for example, a photo sensing device), the electronic device may have excellent operating characteristics and high reliability.

Figure 2:
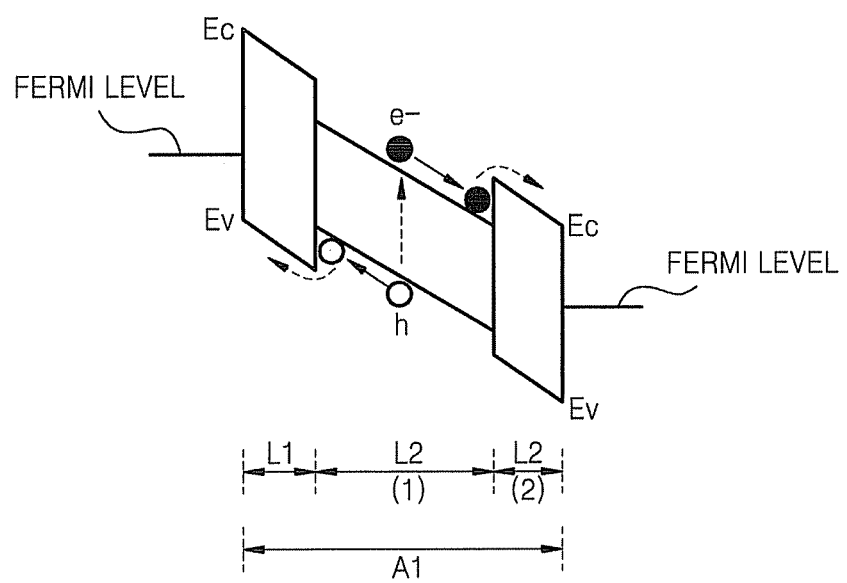
FIG. 2 shows an energy band diagram of an active layer of FIG. 1, according to an example embodiment.

FIG. 2 shows an energy band diagram of the active layer A1 of FIG. 1, according to an example embodiment. In FIG. 2, reference characters $E_C$ and $E_V$ denote the lowermost energy level of a conduction band, and the uppermost energy level of a valence band, respectively. A Fermi energy level is also shown. In addition, reference characters e- and h denote an electron and a hole, respectively. These reference characters are the same in FIG. 4.

Referring to FIG. 2, the energy band gap of the first material layer 1 may be smaller than that of each of the first layer L1 and the second material layer 2. Thus, photocurrent generation may be increased by photoabsorption and photoexcitation in the first material layer 1. The energy band gap of the second material layer 2 may be somewhat smaller than that of the first layer L1. The second material layer 2 may facilitate photosensing, and may protect the first material layer 1 and the first layer L1

Figure 3:
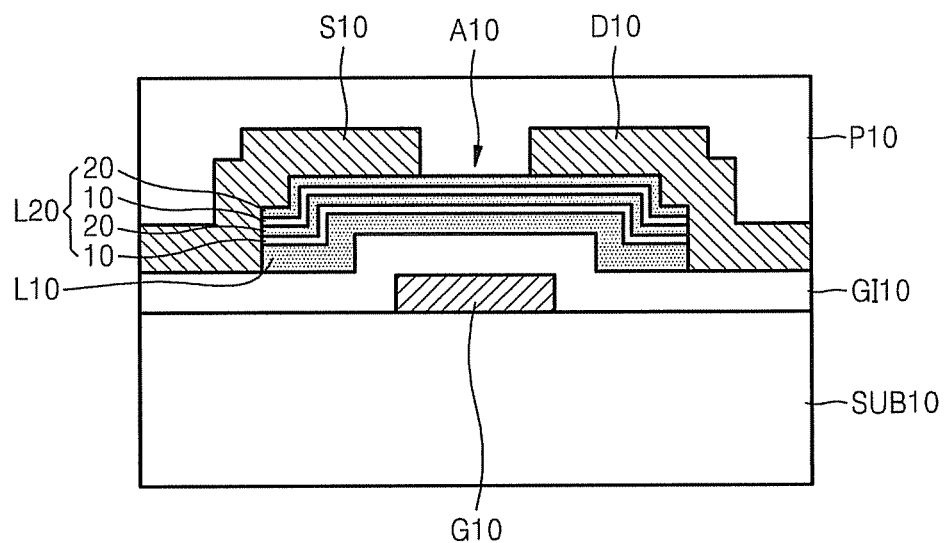
FIG. 3 is a cross-sectional view of a transistor according to another example embodiment.

FIG. 3 is a cross-sectional view of a transistor according to another example embodiment. The transistor according to the present example embodiment is formed by modifying the transistor of FIG. 1.

Referring to FIG. 3, an active layer A10 may include a first layer L10 and a second layer L20. The second layer L20 may have a structure in which a first material layer 10 and a second material layer 20 are alternately stacked two or more times. For example, in the present example embodiment, the second layer L20 may have a four-layer structure in which the first material layer 10 and the second material layer 20 are alternately stacked two times. A structure of the second layer L20 (a photo sensing layer) may be similar to a multi-quantum well structure. A material of the first layer L10 of FIG. 3 may be the same as that of the first layer L1 of FIG. 1. Materials of the first material layer 10 and the second material layer 20 of FIG. 3 may be the same as those of the first material layer 1 and the second material layer 2 of FIG. 1, respectively. A structure of FIG. 3, except for the second layer L20 (i.e., the photo sensing layer), may be the same as that of FIG. 1. That is, a substrate SUB10, a gate G10, a gate insulating layer GI10, a source electrode S10, a drain electrode D10, and a passivation layer P10 of FIG. 3 may correspond to the substrate SUB1, the gate G1, the gate insulating layer G11, the source electrode S1, the drain electrode D1, and the passivation layer P1 of FIG. 1, respectively.

Figure 4:
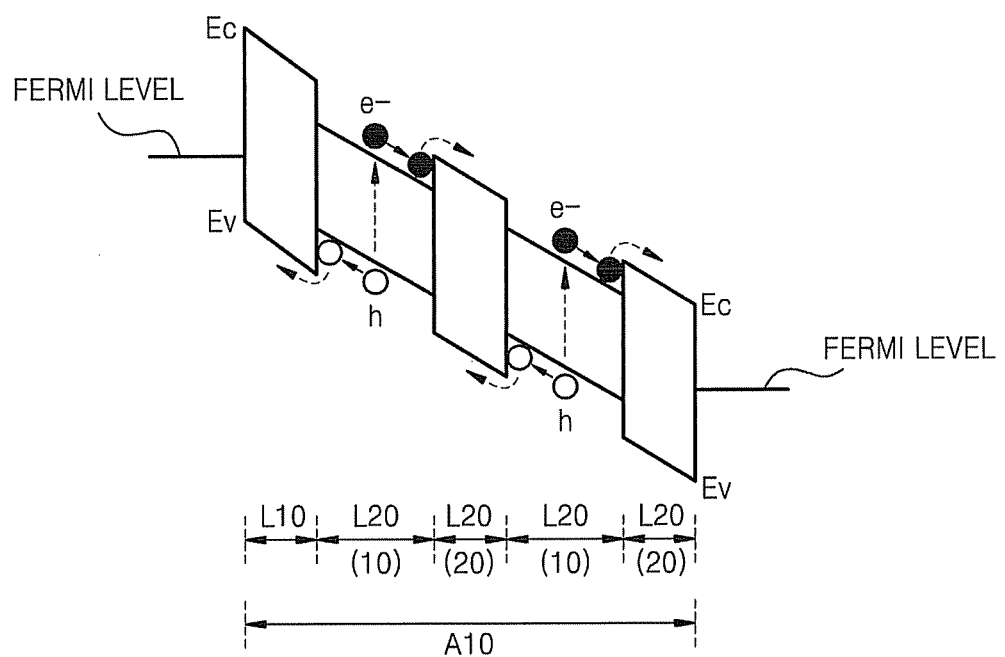
FIG. 4 shows an energy band diagram of an active layer of FIG. 3, according to another example embodiment.

FIG. 4 shows an energy band diagram of the active layer A10 of FIG. 3, according to another example embodiment.

Referring to FIG. 4, the second layer L20 may have a structure in which the first material layer 10 with a relatively small energy band gap and the second material layer 20 with a relatively large energy band gap are alternately disposed. That is, a plurality of first material layers 10 with a relatively small energy band gap are spaced apart from each other, wherein the second material layer 20 with a relatively large energy band gap is disposed between the first material layers 10.

As described with reference to FIGS. 3 and 4, when the second layer L20 (the photo sensing layer) includes the plurality of first material layers 10 and a plurality of second material layers 20, photosensitivity of the transistor may be further increased, and thus photoabsorption, photoexcitation and photocurrent generation efficiency may be largely increased compared to the transistor of FIG. 1.

Figure 5:
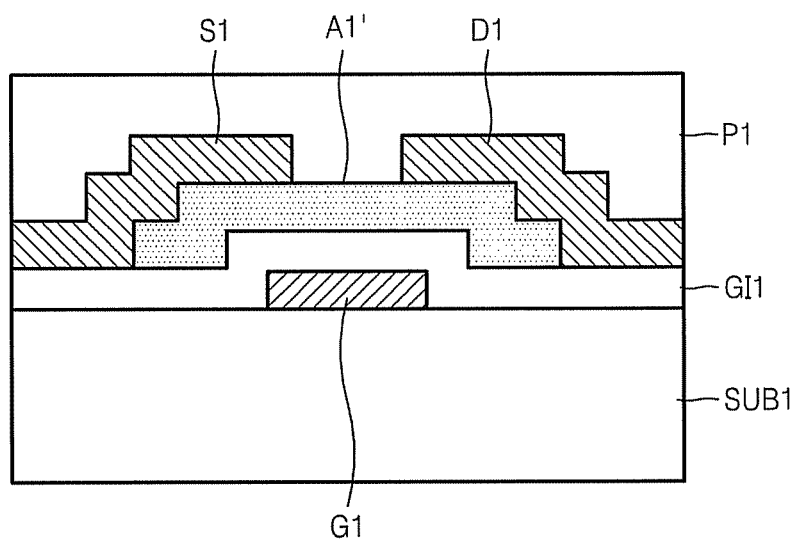
FIG. 5 is a cross-sectional view of a transistor according to a comparative example.

FIG. 5 is a cross-sectional view of a transistor according to a comparative example.

Referring to FIG. 5, the transistor according to the comparative example includes an active layer A1' having a single-layered structure. In this case, the active layer A1' may have a structure excluding the second layer L2 (that is, the photo sensing layer) from the active layer A1 of FIG. 1. In other words, the active layer A1' may have a single-layered structure formed of a material of the first layer L1 (that is, a channel layer) of FIG. 1. A thickness of the active layer A1' may be greater than that of the first layer L1 of FIG. 1. A structure of FIG. 5, except for the active layer A1', may be the same as that of FIG. 1.

Figure 6:
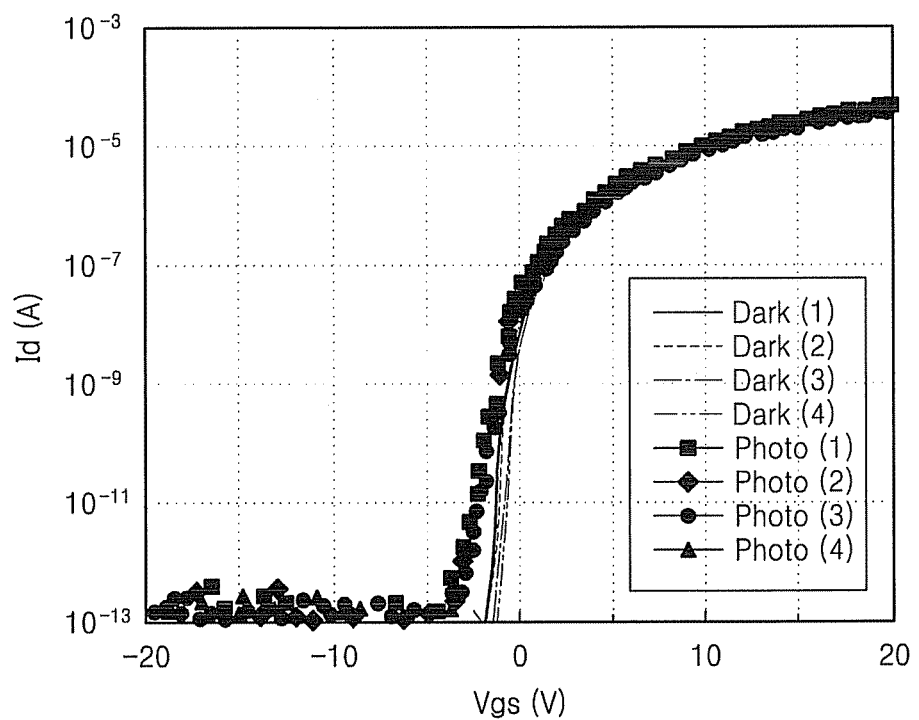
FIG. 6 is a graph showing a result of estimating the photosensitivity of the transistor of FIG. 5.

FIG. 6 is a graph showing a result of estimating the photosensitivity of the transistor of FIG. 5. In this case, the active layer A1' is a HfInZnO layer, and a thickness of the active layer A1' is about 500 Å. In addition, a ratio $(Ar/O_2)$ of Ar gas and $O_2$ gas which are used to form the active layer A1' is 90/10. In FIG. 6, 'Dark' denotes a case where light is not irradiated, and 'Photo' denotes a case where light of about 20,000 nit is irradiated. These denotations are the same in FIGS. 7 and 8.

FIG. 6 illustrates four 'Dark' samples Dark (1), Dark (2), Dark (3) and Dark (4). FIG. 6 also illustrates four 'Photo' samples Photo (1), Photo (2), Photo (3) and Photo (4). Each sample number (e.g., 1) represents a transistor that is manufactured under the same conditions as the other transistors. Referring to FIG. 6, the case where light is not irradiated ('Dark') and the case where light is irradiated ('Photo') are almost not different in a gate voltage (Vgs)-drain current (Id) graph, which means that the photosensitivity of the transistor according to the comparative example is very low. A current $I_{Photo}$ of the case where light is irradiated is $3\times10^{-13}$ A which is very low. A ratio of the current $I_{Photo}$ of the case where light is irradiated with respect to a current $I_{Dark}$ of the case where light is not irradiated, that is, $I_{Photo}/I_{Dark}$ is about 1. In this case, the $I_{Photo}$ and the $I_{Dark}$ were measured at a gate voltage (Vgs) of about −5 V. The measurement conditions of the $I_{Photo}$ and the $I_{Dark}$ are the same in graphs of FIGS. 7 and 8.

Figure 7:
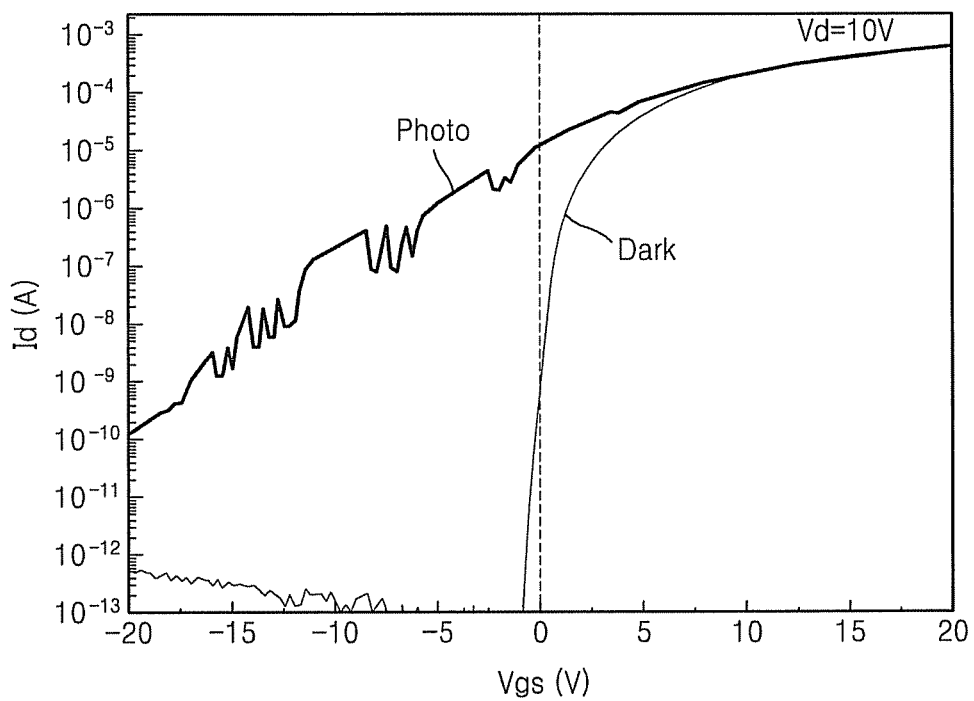
FIG. 7 is a graph showing a result of estimating the photosensitivity of a transistor according to an example embodiment.

FIG. 7 is a graph showing a result of estimating the photosensitivity of a transistor according to an example embodiment. The transistor used to obtain the result of FIG. 7 is the transistor of FIG. 1. In this case, a HfInZnO layer is used as the first layer L1, and a InZnO layer and a HfInZnO layer are used as the first material layer 1 and the second material layer 2 of the second layer L2, respectively. An oxygen content of the HfInZnO layer of the second material layer 2 is greater than that of the HfInZnO layer of the first layer L1. A ratio $(Ar/O_2)$ of Ar gas and $O_2$ gas which are used to form the HfInZnO layer of the first layer L1 is 90/10, and a ratio $(Ar/O_2)$ of Ar gas and $O_2$ gas which are used to form the HfInZnO layer of the second material layer 2 is 80/20. In addition, a ratio $(Ar/O_2)$ of Ar gas and $O_2$ gas which are used to form the InZnO layer of the first material layer 1 is 90/10. Table 1 shows compositions, formation conditions, and optical energy band gaps of the active layer A1 of the transistor of FIG. 1, which is used to obtain the result of FIG. 7.

TABLE 1

| | | L2 | |
|---|---|---|---|
| Division | L1 | 1 | 2 |
| Material | HfInZnO | InZnO | HfInZnO |
| Ar/O$_2$ during formation | 90/10 | 90/10 | 80/20 |
| Thickness (Å) | 270 | 250 | 200 |
| Energy band gap (eV) | 3.25 | 3.10 | 3.20 |

Referring to FIG. 7, the case where light is not irradiated ('Dark') and the case where light is irradiated ('Photo') are considerably different in a gate voltage (Vgs)-drain current (Id) graph. When light is irradiated ('Photo'), an off-current level is remarkably increased compared to the case where light is not irradiated ('Dark'). That is, for gate voltages less than 0 V, a graph of the case where light is irradiated ('Photo') is positioned considerably above a graph of the case where light is not irradiated ('Dark'). A current $I_{Photo}$ of the case where light is irradiated is about $10^{-6}$ A. A ratio of the current $I_{Photo}$ of the case where light is irradiated with respect to a current $I_{Dark}$ of the case where light is not irradiated, that is, $I_{Photo}/I_{Dark}$ is about $10^7$. Comparing the result of FIG. 7 with the result of FIG. 6, the transistor according to the present example embodiment has considerably higher photosensitivity than that of the transistor according to the comparative example. That is, by using the second layer L2 (i.e., the photo sensing layer) including a material with a small energy band gap, the photosensitivity of a transistor may be increased.

Figure 8:
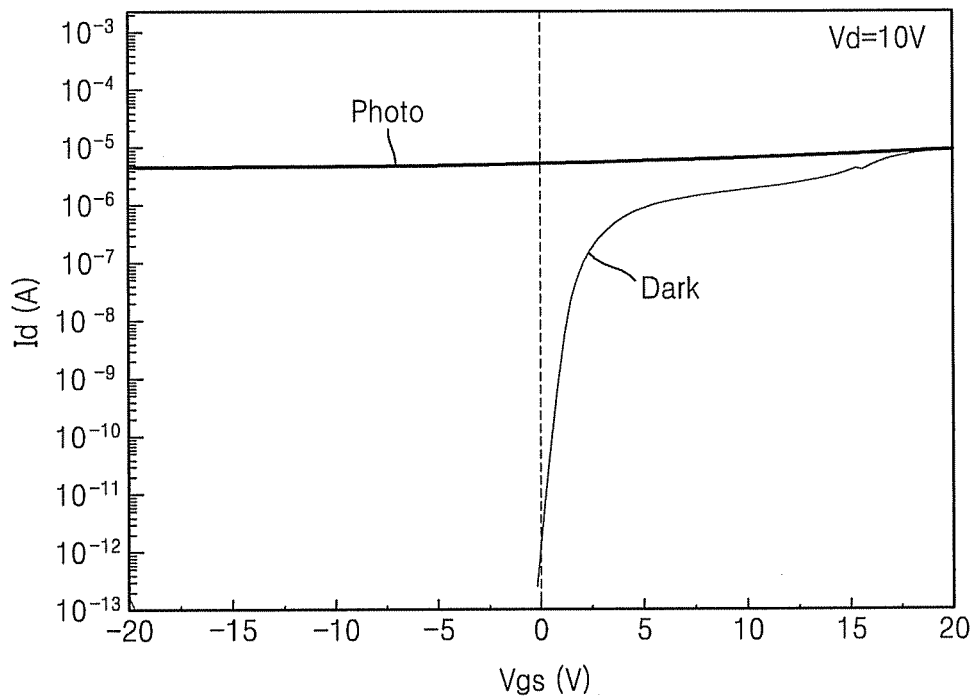
FIG. 8 is a graph showing a result of estimating the photosensitivity of a transistor according to another example embodiment.

FIG. 8 is a graph showing a result of estimating the photosensitivity of a transistor according to another example embodiment. The transistor used in FIG. 8 corresponds to the transistor of FIG. 3. In this case, a HfInZnO layer is used as the first layer L10, and a InZnO layer and a HfInZnO layer are used as the first material layer 10 and the second material layer 20 of the second layer L20, respectively. An oxygen content of the HfInZnO layer of the second material layer 20 is higher than that of the HfInZnO layer of the first layer L10. A ratio ($Ar/O_2$) of Ar gas and $O_2$ gas that are used to form the HfInZnO layer of the first layer L10 is 90/10, and a ratio ($Ar/O_2$) of Ar gas and $O_2$ gas that are used to form the HfInZnO layer of the second material layer 20 is 80/20. In addition, a ratio ($Ar/O_2$) of Ar gas and $O_2$ gas that are used to form the InZnO of the first material layer 10 is 90/10. Table 2 shows compositions, formation conditions, and optical energy band gaps of the active layer A10 of the transistor of FIG. 3, which is used to obtain the result of FIG. 8.

TABLE 2

| Division | L10 | L20 | | | |
|---|---|---|---|---|---|
| | | 10 | 20 | 10 | 20 |
| Material | HfInZnO | InZnO | HfInZnO | InZnO | HfInZnO |
| $Ar/O_2$ during formation | 90/10 | 90/10 | 80/20 | 90/10 | 80/20 |
| Thickness (Å) | 270 | 170 | 150 | 170 | 200 |
| Energy band gap (eV) | 3.25 | 3.10 | 3.20 | 3.10 | 3.20 |

Referring to FIG. 8, when light is irradiated, a current $I_{Photo}$ is about $8\times10^{-6}$ A, which is higher than that in FIG. 7. A ratio of the current $I_{Photo}$ of the case where light is irradiated with respect to a current $I_{Dark}$ of the case where light is not irradiated, that is, $I_{Photo}/I_{Dark}$ is about $10^8$, which is higher than that in FIG. 7. Thus, when the second layer L20 (i.e., the photo sensing layer) is configured to be similar to a multi-quantum well structure, like in FIG. 3, the photosensitivity of a transistor may be further increased.

Figure 9:
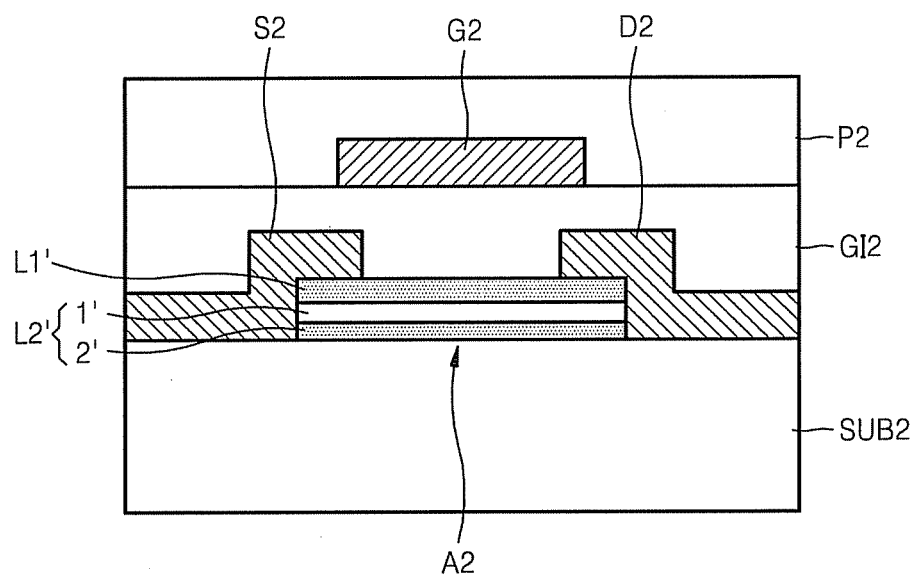
FIG. 9 is a cross-sectional view of a transistor according to another example embodiment.
Figure 10:
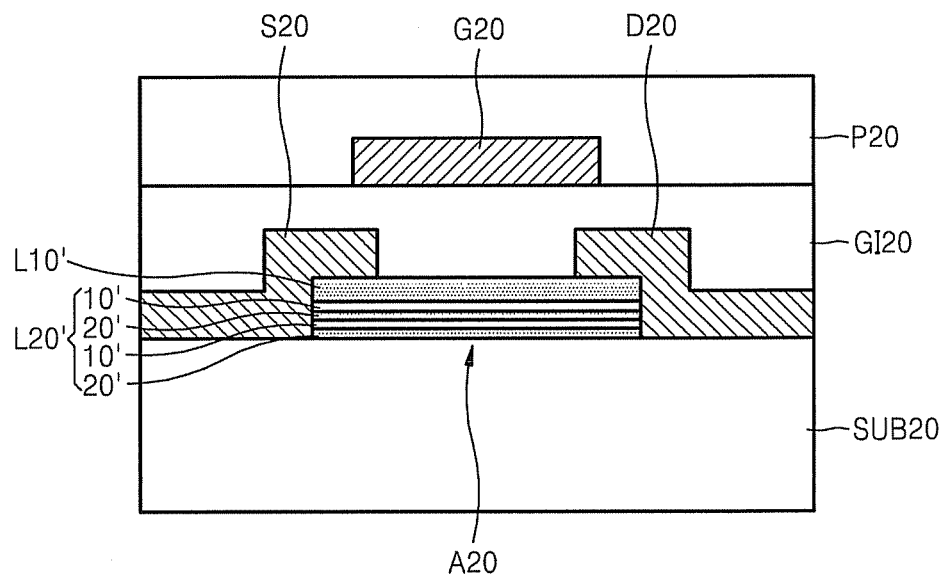
FIG. 10 is a cross-sectional view of a transistor according to another example embodiment.

Above, a bottom-gate type transistor has been described, but aspects of example embodiments may also be applied to a top-gate type transistor, examples of which are shown in FIGS. 9 and 10. FIG. 9 is a cross-sectional view of a top-gate type transistor formed by modifying the transistor of FIG. 1, according to another example embodiment. FIG. 10 is a cross-sectional view of a top-gate type transistor formed by modifying the transistor of FIG. 3, according to another example embodiment.

Referring to FIG. 9, an active layer A2 may be disposed on a substrate SUB2. The active layer A2 may be formed of an oxide semiconductor, and may have a multi-layered structure including at least two layers. For example, in the present example embodiment, the active layer A2 may include a second layer L2' and a first layer L1' that are sequentially stacked. The second layer L2' may have a single-layer or multi-layered structure. When the second layer L2' has a multi-layered structure, the second layer L2' may include a second material layer 2' and a first material layer 1' that are sequentially stacked, as described in FIG. 9. The active layer A2 may be similar to an inverse structure of the active layer A1 of FIG. 1. A source electrode S2 and a drain electrode D2 may be disposed on both ends of the active layer A2, respectively. A gate insulating layer GI2 may be disposed to cover the active layer A2, the source electrode S2, and the drain electrode D2. A gate G2 may be disposed on the gate insulating layer GI2. The gate G2 may be disposed above the active layer A2. A passivation layer P2 may be disposed on the gate insulating layer GI2 so as to cover the gate G2. Materials and thicknesses of the substrate SUB2, the source electrode S2, the drain electrode D2, the first layer L1', the first material layer 1' of the second layer L2', the second material layer 2' of the second layer L2', the gate insulating layer GI2, the gate G2, and the passivation layer P2 of FIG. 9 may be the same as materials and thicknesses of the substrate SUB1, the source electrode S1, the drain electrode D1, the first layer L1, the first material layer 1 of the second layer L2, the second material layer 2 of the second layer L2, the gate insulating layer GI1, the gate G1 and the passivation layer P1 of FIG. 1, respectively. Also in FIG. 9, the photosensitivity of the transistor may be improved due to the second layer L2' (i.e., the photo sensing layer), and the reliability and uniformity of the transistor may also be improved.

Referring to FIG. 10, an active layer A20 may be similar to an inverse structure of the active layer A10 of FIG. 3. That is, the active layer A20 may include a first layer L10' and a second layer L20' that are sequentially disposed from a side of the gate G20, and the second layer L20' may have a stack structure in which a first material layer 10' and a second material layer 20' are alternately stacked two or more times on a surface (i.e., a bottom surface) of the first layer L10'. A material of the first layer L10' may correspond to a material of the first layer L10 of FIG. 3, and materials of the first material layer 10' and the second material layer 20' may correspond to materials of the first material layer 10 and the second material layer 20 of FIG. 3, respectively. A structure of FIG. 10, except for the active layer A20, may be the same as that of FIG. 9. That is, a substrate SUB 20, a source electrode S20, a drain electrode D20, a gate insulating layer G120, a gate G20 and a passivation layer P20 of FIG. 10 may correspond to the substrate SUB2, the source electrode S2, the drain electrode D2, the gate insulating layer G12, the gate G2 and the passivation layer P2 of FIG. 9, respectively. When the second layer L20' (i.e., the photo sensing layer) of the active layer A20 is configured to be similar to a multi-quantum well structure, like in FIG. 10, the photosensitivity of a transistor may be further increased.

A transistor according to one or more example embodiments may be used in various electronic devices. For example, the transistor may be used as a sensor transistor of a photo sensing circuit. In this case, the sensing performance and reliability of the photo sensing circuit may be improved. The photo sensing circuit may further include a switching device connected to the transistor. The switching device may be, for example, a switching transistor. A photosensor array may be manufactured by arranging a plurality of unit circuits each of which includes the sensor transistor and the switching transistor connected to the sensor transistor, and the photosensor array may be applied to a flat display apparatus. Thus, the flat display apparatus may be remotely manipulated (controlled) by using external light. A basic structure of a photo sensing circuit, a structure of a photosensor array, and a structure of a flat display apparatus are well known, and thus detailed descriptions thereof will be omitted. The transistor according to one or more example embodiments may be for various purposes in various electronic devices other than a photosensor array and a flat display apparatus.

Figure 13:
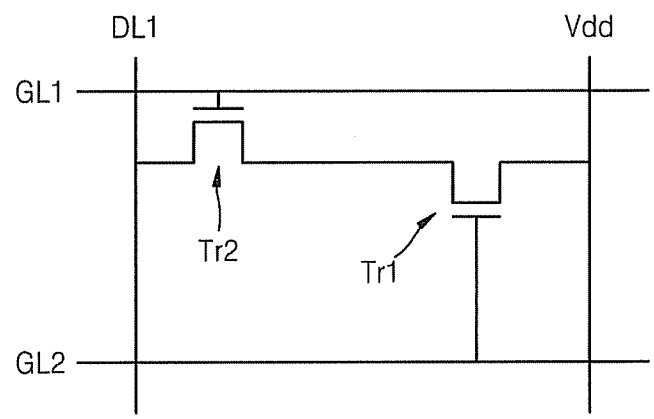
FIG. 13 illustrates a unit circuit configuration of a photosensor array according to an example embodiment.

For example, FIG. 13 illustrates an example of a unit circuit configuration of a photosensor array according to an example embodiment. Referring to FIG. 13, a first gate line GL1 and a second gate line GL2 may be disposed in parallel to each other, and a data line DL1 and a power source line Vdd may be disposed to cross the first and second gate lines GL1 and GL2. The unit circuit may include a sensor transistor Tr1 and a switching transistor Tr2 connected to the sensor transistor Tr1. The sensor transistor Tr1 may be one of the transistors according to example embodiments, and may be connected between the second gate line GL2 and the power source line Vdd. The switching transistor Tr2 may be connected between the first gate line GL1 and the data line DL1. When the sensor transistor Tr1 is irradiated by a light, a photocurrent may be generated from the sensor transistor Tr1, and therefore, if the switching transistor Tr2 is turned on, data may be output through the sensor transistor Tr1 and the switching transistor Tr2. The unit circuit configuration shown in FIG. 13 is merely an example, and thus, the unit circuit configuration may be modified in various ways. Also, a plurality of the unit circuits may be arranged for forming a photosensor array, and the photosensor array may be applied to a flat display apparatus.

A method of manufacturing a transistor according to an example embodiment will now be described.

FIGS. 11A through 11D are cross-sectional views for explaining a method of manufacturing a transistor, according to an example embodiment. The transistor according to the present example embodiment is a bottom-gate type transistor. In FIGS. 1, and 11A through 11D, like reference numerals in the drawings denote like elements.

Figure 11A:
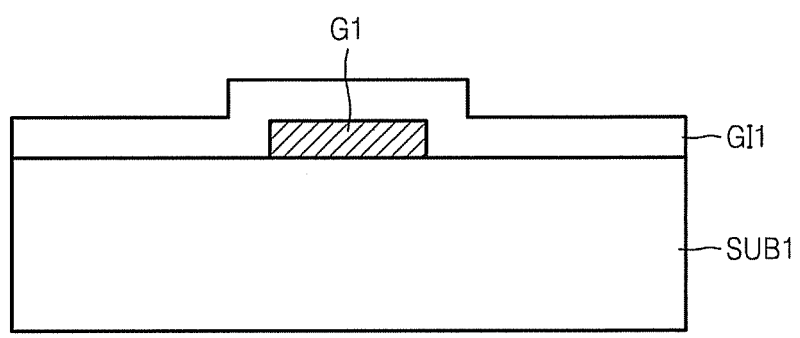
FIGS. 11A through 11D are cross-sectional views for explaining a method of manufacturing a transistor, according to an example embodiment.

Referring to FIG. 11A, a gate G1 may be formed on a substrate SUB1, and a gate insulating layer GI1 may be formed so as to cover the gate G1. The substrate SUB1 may be a glass substrate, or alternatively, may be any one of various substrates used in a general method of manufacturing a semiconductor device, for example, a plastic substrate, or a silicon substrate. The gate G1 may be formed of a general electrode material (e.g., a metal, a conductive oxide, or the like). The gate insulating layer GI1 may be a silicon oxide layer, or a silicon nitride layer, or alternatively, may be another material layer, for example, a high dielectric material layer with a greater dielectric constant than a silicon nitride layer. The gate insulating layer GI1 may have a stack structure including at least two layers from among a silicon oxide layer, a silicon nitride layer, and a high dielectric material layer.

Figure 11B:
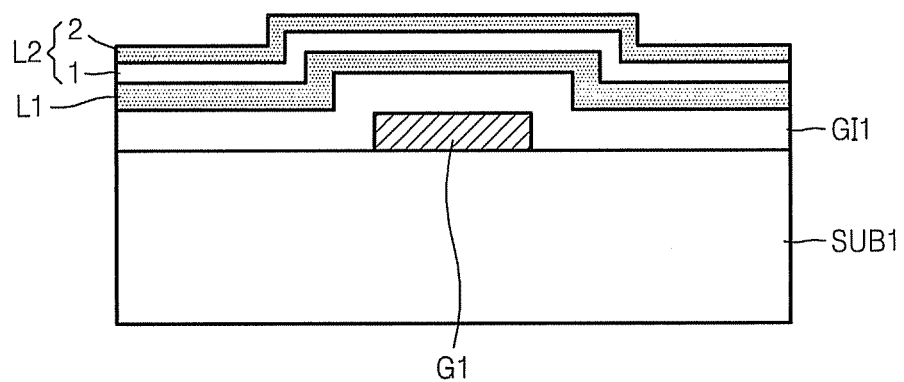

Referring to FIG. 11B, an oxide semiconductor thin film having a multi-layered structure for forming an active layer may be formed on the gate insulating layer GI1. For example, a first layer L1 and a second layer L2 may be sequentially formed. The second layer L2 may be formed by sequentially forming a first material layer 1 and a second material layer 2. The first layer L1 and the second layer L2 may be formed by using a physical vapor deposition method, such as a sputtering method or an evaporation method, or alternatively, by using a chemical vapor deposition method, an atomic layer deposition method, or the like. An oxide semiconductor for forming the first layer L1 may include a ZnO-based oxide semiconductor. In this case, the ZnO-based semiconductor may include at least one selected from a transition metal such as Hf, Y, Ta, Zr, Ti, Cu, Ni and Cr, a group III element such as In, Ga and Al, a group IV element such as Sn, a group II element such as Mg, or other elements. For example, the first layer L1 may include HfInZnO, GaInZnO, or the like. The second layer L2 may include a material with a smaller energy band gap than the first layer L1. As an energy band gap is reduced, photosensitivity may be increased. Thus, the second layer L2 may have higher photosensitivity than the first layer L1. In the second layer L2, the energy band gap of the first material layer 1 may be smaller than that of the second material layer 2. In addition, the energy band gap of the first material layer 1 may be smaller than that of the first layer L1. For example, the first material layer 1 may include InZnO, TiOx, or the like, or alternatively, may include another oxygen semiconductor with a high oxygen content. However, a material of the first material layer 1 is not limited to the above-described material, and thus the first material layer 1 may be formed of various materials. The energy band gap of the second material layer 2 may be smaller than that of the first layer L1. As described above, since as an oxygen content of an oxide semiconductor is increased, an energy band gap of the oxide semiconductor may be reduced, an oxygen content of the second material layer 2 may be greater than that of the first layer L1. In addition, electrical resistance of the second material layer 2 may be greater than that of the first layer L1. The second material layer 2 may facilitate photosensing, and may protect the first material layer 1 and the first layer L1 disposed therebelow during subsequent processes. Thus, the characteristics of the first layer L1 and the second layer L2 may be prevented from deteriorating by the second material layer 2. The second material layer 2 may be formed of an oxide semiconductor of the same group as or similar group to the first layer L1. For example, the second material layer 2 may be formed of an oxide semiconductor of the same group as the first layer L1, and an oxygen content of the second material 2 is increased compared to the first layer L1. In detail, the second material layer 2 may include HfInZnO or GaInZnO with a higher oxygen content than the first layer L1. When the first layer L1 and the second material layer 2 are formed of HfInZnO, a ratio ($Ar/O_2$) of Ar gas and $O_2$ gas that are used to form the first layer L1 may be about 90/10, and a ratio ($Ar/O_2$) of Ar gas and $O_2$ gas that are used to form the second material layer 2 may be about 80/20. However, this is exemplary only, and thus a ratio ($Ar/O_2$) of Ar gas and $O_2$ gas that are used to form the first layer L1 and the second material layer 2 may be variously changed. In addition, the second material layer 2 may be formed of various materials. If necessary, the energy band gap of the second material layer 2 may be the same or similar as that of the first layer L1.

Figure 11C:
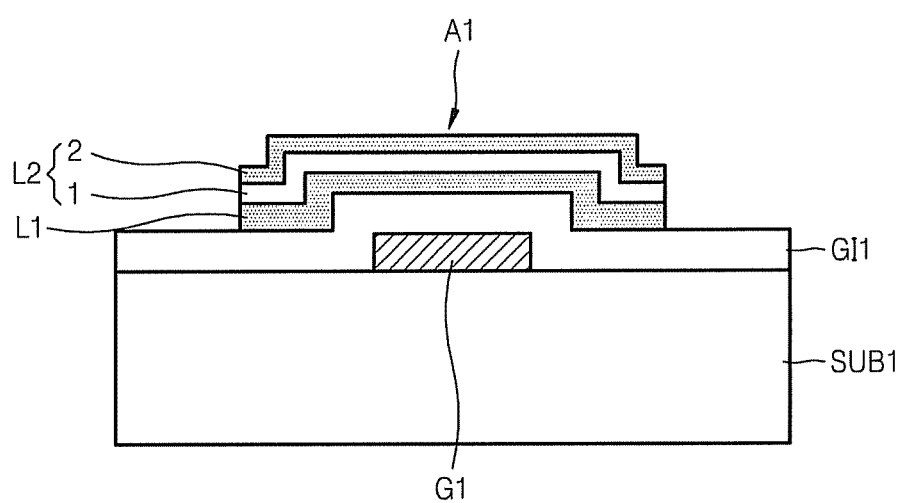

As illustrated in FIG. 11C, an active layer A1 may be formed by patterning the first layer L1 and the second layer L2. The patterned first layer L1 may be the same as the first layer L1 of FIG. 1, and the patterned second layer L2 may be the same as the second layer L2 of FIG. 1.

Figure 11D:
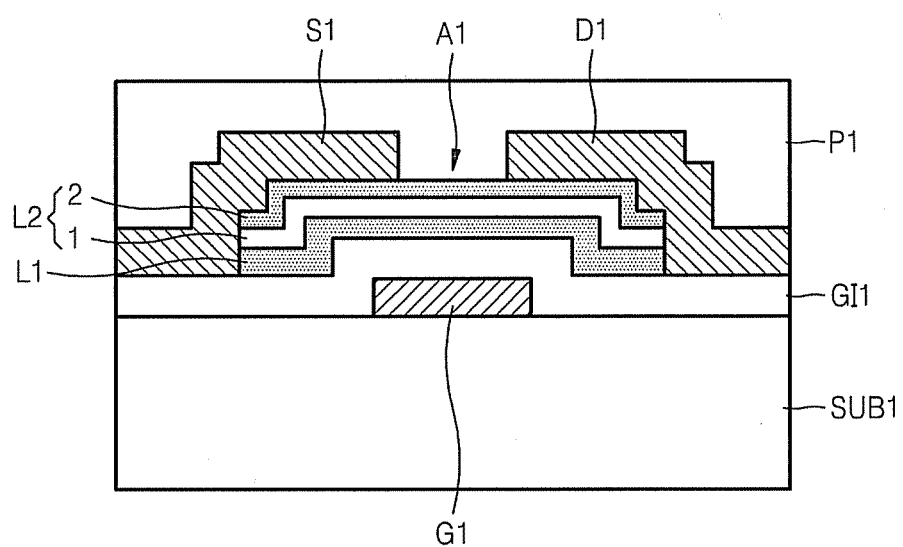

Referring to FIG. 11D, a source electrode S1 and a drain electrode D1 may be formed on the gate insulating layer GI1 so as to contact two ends of the active layer A1, respectively, and to expose a portion of an upper surface of the active layer A1. The source electrode S1 and the drain electrode D1 may each include a single layer, or a plurality of layers. Then, a passivation layer P1 may be formed on the substrate SUB1 so as to cover the exposed portion of the active layer A1, and the source electrode S1 and the drain electrode D1. The passivation layer P1 may be, for example, a silicon oxide layer, a silicon nitride layer, or an organic layer, or alternatively, may have a stack structure including at least two layers thereof.

The transistor formed by the above-described method may be annealed at a predetermined temperature.

The transistor of FIG. 3 may be manufactured by modifying the method described with reference to FIGS. 11A through 11D. That is, in FIG. 11B, the first material layer 1 and the second material layer 2 may be alternately stacked two or more times, and the first material layers 1 and the second material layers 2 may be patterned together with the first layer L1 so as to obtain the active layer A10 of FIG. 3. Then, the transistor including the active layer A10 may be manufactured.

FIGS. 12A through 12D are cross-sectional views for explaining a method of manufacturing a transistor, according to an example embodiment. The transistor according to the present example embodiment is a top-gate type transistor. In FIGS. 9, and 12A through 12D, like reference numerals in the drawings denote like elements.

Figure 12A:
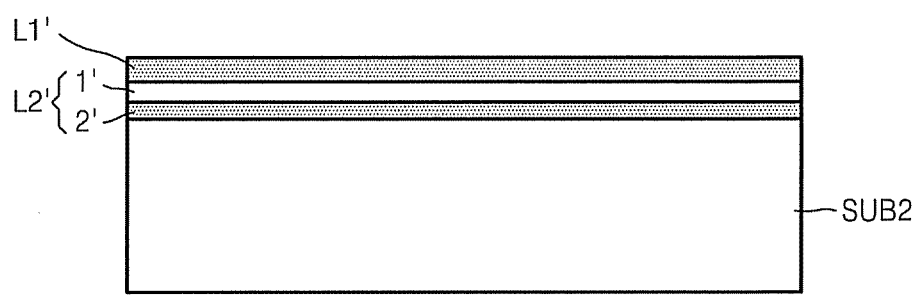
FIGS. 12A through 12D are cross-sectional views for explaining a method of manufacturing a transistor, according to an example embodiment.

Referring to FIG. 12A, an oxide semiconductor thin film having a multi-layered structure for forming an active layer may be formed on a substrate SUB2. For example, a second layer L2' and a first layer L1 may be sequentially stacked. In this case, the second layer L2' may be formed by sequentially stacking a second material layer 2' and a first material layer 1'. The first material layer 1' and the second material layer 2' may be formed of the same materials of the first material layer 1 and the second material layer 2 of FIG. 11B, respectively. The first layer L1 may be formed of the same material of the first layer L1 of FIG. 11B. Thus, materials and formation methods of the first material layer 1', the second material layer 2' and the first layer L1' may be the same as materials and formation methods of the first material layer 1, the second material layer 2 and the first layer L1 of FIG. 11B.

Figure 12B:
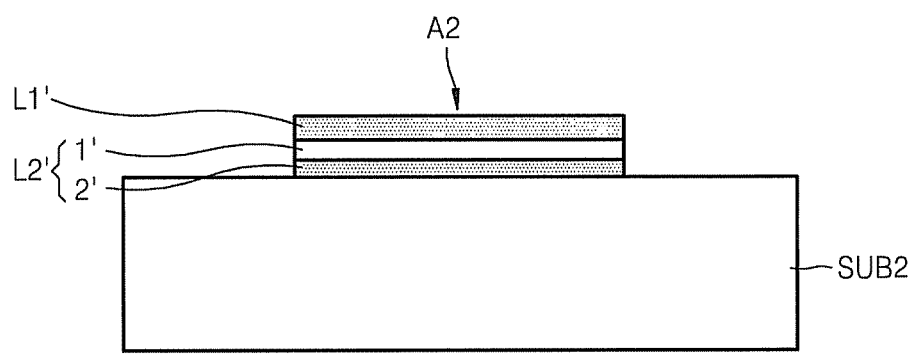

The first layer L1' and the second layer L2' may be patterned so as to form a active layer A2, as illustrated in FIG. 12B. The patterned first layer L1 and the patterned second layer L2' may be the same as the first layer L1' and the second layer L2' of FIG. 9, respectively.

Figure 12C:
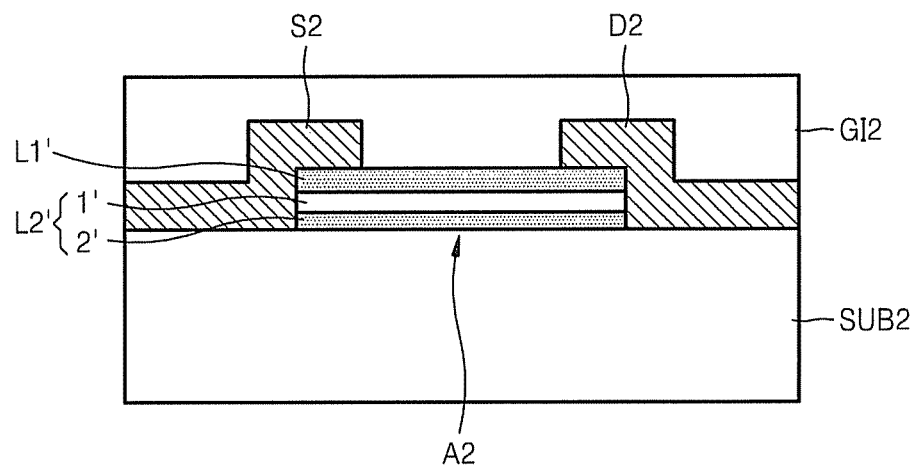

Referring to FIG. 12C, a source electrode S2 and a drain electrode D2 may be formed on the substrate SUB2. The source electrode S2 and the drain electrode D2 may be formed so as to contact two ends of the active layer A2, respectively. Then, a gate insulating layer G12 may be formed so as to cover the active layer A2, the source electrode S2, and the drain electrode D2. The gate insulating layer G12 may be formed of the same material as the gate insulating layer GI1 of FIG. 11A.

Figure 12D:
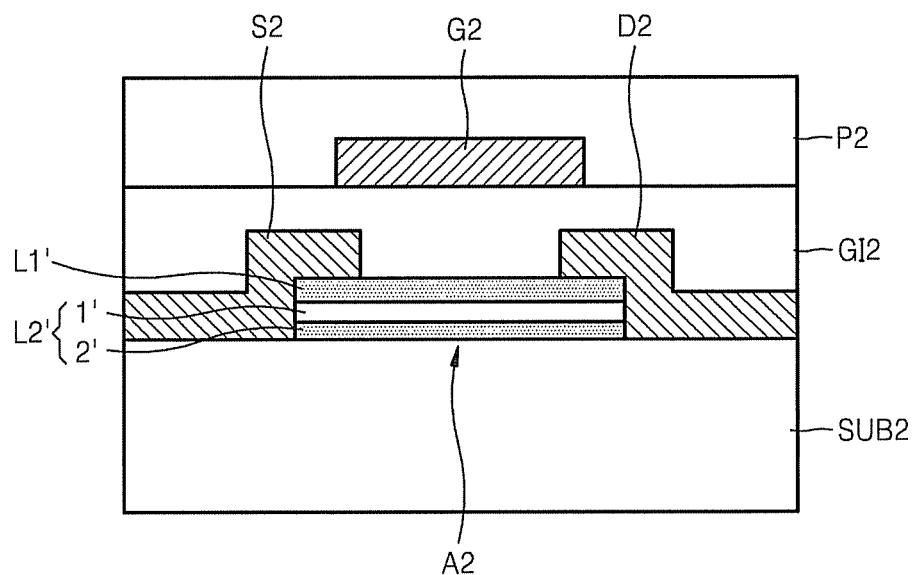

Referring to FIG. 12D, a gate G2 may be formed on the gate insulating layer G12. The gate G2 may be formed above the active layer A2. The gate G2 may be formed of the same material as the source electrode S2 and the drain electrode D2, or alternatively, may be formed of a different material from the source electrode S2 and the drain electrode D2. A passivation layer P2 may be formed on the gate insulating layer G12 so as to cover the gate G2. The passivation layer P2 may be, for example, a silicon oxide layer, a silicon nitride layer, or an organic layer, or alternatively, may have a stack structure including at least two layers thereof. The transistor formed by the above-described method may be annealed at a predetermined temperature.

The transistor of FIG. 10 may be manufactured by modifying the method described with reference to FIGS. 12A through 12D. That is, in FIG. 12A, the second material layer 2' and the first material layer 1' may be alternately stacked two or more times, the first layer L1 may be disposed on the stack structure of the second material layers 2' and the first material layers 1', and then the resulting structure may be patterned so as to obtain the active layer A20 of FIG. 10. Then, the transistor including the active layer A20 may be manufactured.

By using the above-described method, a transistor including the second layer L2, L2', L20, or L20' (i.e., the photo sensing layer) may be manufactured. The transistor may have relatively high photosensitivity. Thus, when the transistor is used in an electronic device, the electronic device, for example, a photo sensing device may have excellent performance and high reliability.

It should be understood that example embodiments described herein should be considered in a descriptive sense only and not for purposes of limitation. For example, it will be understood that the transistors of FIGS. 1, 3, 9, and 10 may be changed in various forms. In detail, in the transistors of FIGS. 1, 3, 9, and 10, the first layers (i.e., the channel layers) L1, L1', L10, and L10' may each have a multi-layered structure, and the second layers (i.e., the photo sensing layers) L2, L2', L20, and L20' may each have a single-layered structure. When the second layers (i.e., the photo sensing layers) L2, L2', L20, and L20' each have a single-layered structure, the second layer (i.e., the photo sensing layers) L2, L2', L20, and L20' may be formed of the same materials as the first material layers 1, 1', 10, and 10', respectively. In addition, the source electrodes S1, S10, S2, and S20, and the drain electrodes D1, D2, D10, and D20 may contact two ends of lower surfaces of the active layers A1, A10, A2, and A20, but not two ends of upper surfaces of the active layers A1, A10, A2, and A20, respectively. In addition, the transistor according to one or more example embodiments may have a double-gate type structure. In addition, the methods described with reference to FIGS. 11A through 11D, and 12A through 12D may be changed in various forms. In addition, it will be obvious to one of ordinary skill in the art that inventive concepts of one or more example embodiments may be applied to not only an oxide thin film transistor but to other transistors.

It should be understood that example embodiments described herein should be considered in a descriptive sense only and not for purposes of limitation. Descriptions of features or aspects within each example embodiment should typically be considered as available for other similar features or aspects in other example embodiments.

What is claimed is:

1. A transistor comprising:
   an active layer including an oxide semiconductor;
   a source electrode and a drain electrode contacting two ends of the active layer, respectively;
   a gate corresponding to the active layer; and
   a gate insulating layer between the active layer and the gate,
   wherein the active layer includes a first layer and a second layer that are sequentially stacked from a side of the gate, and the second layer includes a material having a smaller energy band gap than the first layer, and a photosensitivity of the second layer being higher than a photosensitivity of the first layer, and
   the second layer includes a first material layer and a second material layer that are sequentially stacked on a surface of the first layer, the second material layer is farther from the gate than the first material layer, and an energy band gap of the second material layer is smaller than an energy band gap of the first layer.

2. The transistor of claim 1, wherein the first layer comprises a ZnO-based oxide.

3. The transistor of claim 2, wherein the ZnO-based oxide comprises at least one of hafnium (Hf), yttrium (Y), tantalum (Ta), zirconium (Zr), titanium (Ti), copper (Cu), nickel (Ni), chromium (Cr), indium (In), gallium (Ga), aluminum (Al), tin (Sn), and magnesium (Mg).

4. The transistor of claim 3, wherein the first layer comprises HfInZnO or GaInZnO.

5. The transistor of claim 1, wherein the second layer has a multi-layered structure.

6. The transistor of claim 1, wherein an energy band gap of the first material layer is smaller than an energy band gap of the second material layer.

7. The transistor of claim 1, wherein the first material layer comprises InZnO or TiOx.

8. The transistor of claim 1, wherein an electrical resistance of the second material layer is greater than an electrical resistance of the first layer.

9. The transistor of claim 1, wherein the second material layer and first layer comprise a ZnO-based oxide.

10. The transistor of claim 1, wherein the first material layer and the second material layer are alternately stacked at least twice.

11. The transistor of claim 1, wherein the gate is below the active layer.

12. The transistor of claim 1, wherein the gate is above the active layer.

13. A transistor comprising:
an active layer including an oxide semiconductor;
a source electrode and a drain electrode contacting two ends of the active layer, respectively;
a gate corresponding to the active layer; and
a gate insulating layer between the active layer and a gate electrode,
wherein the active layer includes a first layer and a second layer that are sequentially stacked from a side of the gate, the second layer includes a material having a smaller energy band gap than the first layer, and a photosensitivity of the second layer being higher than a photosensitivity of the first layer, and
an oxygen content of the second material layer is greater than an oxygen content of the first layer.

14. An electronic device comprising:
the transistor of claim 1.

15. A photo sensing circuit comprising:
the transistor of claim 1.

16. The photo sensing circuit of claim 15, further comprising:
a switching device connected to the transistor.

17. A transistor comprising:
an active layer including an oxide semiconductor;
a source electrode and a drain electrode contacting two ends of the active layer, respectively;
a gate corresponding to the active layer; and
a gate insulating layer between the active layer and the gate,
wherein the active layer includes a channel layer and a photo sensing layer, the photo sensing layer has a higher photosensitivity than the channel layer, and the channel layer is closer to the gate than the photo sensing layer, and
the photo sensing layer includes a first material layer and a second material layer that are sequentially stacked on a surface of the channel layer and an energy band gap of the second material layer is smaller than an energy band gap of the channel layer.

18. The transistor of claim 17, wherein the first material layer and the second material layer are alternately stacked at least twice.

* * * * *